United States Patent
Grishin et al.

(10) Patent No.: US 10,475,981 B2
(45) Date of Patent: Nov. 12, 2019

(54) THERMOELECTRIC MODULE

(71) Applicant: AKTSIONERNOE OBSCHESTVO "AVTOSHTAMP", Moscow (RU)

(72) Inventors: Valeriy Ivanovich Grishin, Moscow (RU); Tat'yana Nikolaevna Maeva, Moscow (RU)

(73) Assignee: AKTSIONERNOE OBSCHESTVO "AVTOSHTAMP", Moscow (RU)

( * ) Notice: Subject to any disclaimer, the term of this patent is extended or adjusted under 35 U.S.C. 154(b) by 529 days.

(21) Appl. No.: 14/764,059

(22) PCT Filed: Feb. 20, 2014

(86) PCT No.: PCT/RU2014/000110
§ 371 (c)(1),
(2) Date: Jul. 28, 2015

(87) PCT Pub. No.: WO2014/116145
PCT Pub. Date: Jul. 31, 2014

(65) Prior Publication Data
US 2016/0005946 A1    Jan. 7, 2016

(30) Foreign Application Priority Data
Jan. 28, 2013  (RU) ................. 2013103458

(51) Int. Cl.
*H01L 35/32* (2006.01)
*H01L 35/10* (2006.01)
*H01L 35/30* (2006.01)
*H01L 35/18* (2006.01)

(52) U.S. Cl.
CPC .............. *H01L 35/32* (2013.01); *H01L 35/10* (2013.01); *H01L 35/18* (2013.01); *H01L 35/30* (2013.01)

(58) Field of Classification Search
CPC ................................ H01L 35/32; H01L 35/00
USPC .................................................. 136/200–242
See application file for complete search history.

(56) References Cited

U.S. PATENT DOCUMENTS

| | | | | |
|---|---|---|---|---|
| 2008/0041067 A1* | 2/2008 | Matsuoka | ............... | H01L 35/30 62/3.7 |
| 2011/0298080 A1* | 12/2011 | Hiroyama | ............... | H01L 35/34 257/467 |

\* cited by examiner

*Primary Examiner* — Niki Bakhtiari
(74) *Attorney, Agent, or Firm* — Galgano IP Law PLLC; Thomas M. Galgano

(57) ABSTRACT

The invention relates to thermoelectric devices and can be used in a variety of devices which utilize thermoelectric modules. A thermoelectric module containing n and p-type conductivity semiconducting branches, connected by means of switching buses into an electric circuit, and a protective polymer coating. The protective polymer coating is applied to the interconnected branches and buses, and the coating is an electrodepositable polymer varnish-paint composition modified with a fluoroelastomer latex.

9 Claims, 2 Drawing Sheets

THERMOELECTRIC MODULE

This invention relates to thermoelectric devices and may be used in miscellaneous devices utilizing thermoelectric modules.

Known is a thermoelectric module containing N- and P-type conductivity semiconductor branches connected into an electric circuit through switching buses and a protective polymer coating (refer to USA Application No. 2008000511 (A1) dated 2008 Jan. 3 No. 2008041067 (A1) dated Feb. 21, 2008).

The disadvantage of the known thermoelectric module is that electrodeposition of the coating on the thermoelectric module's inner parts, specifically on the N- and P-type semiconductor branches enclosed in a frame (thermal insulation plate), and buses does not provide a uniform continuous protective polymer coating. This is due to the method employed to produce the thermoelectric module as described in the closest analogues (ref. to US Applications No. 2008000511 (A1) dated Jan. 3, 2008 No 2008041067 (A1) dated Feb. 21, 2008). The method includes a process of connection of heat-exchanger plates and thermoelectric elements of the thermoelectric module, and a process of the thermoelectric module immersion into an electropaint bath. The immersion is performed after the connection process is completed. Application of the protective polymer coating is followed by thermal hardening in a furnace. It is crucial that the immersion process is performed after all the components are connected to each other. A uniform continuous protective polymer coating can only be formed on the thermoelectric module's outer components (heat-exchanger plates), while electrodeposition of the paint on the thermoelectric module's inner components is prevented due a complex geometry not allowing complete insulation.

The above disadvantage is further added by the use of epoxy resin-based paint lacking the required high dispersive capacity. Furthermore, the resulting protective polymer epoxy-based coating is non-elastic thus resulting in the coating cracking and loss of insulation integrity during the thermoelectric module operation.

The technical result of the invention is improved reliability of the thermoelectric module due to the removal of the above disadvantages by providing full protection of the module's electricity conducting components by means of an elastic protective polymer coating. For example: thermoelectric module's continuous time to failure without sealing along the perimeter (without sealing the heat-exchanger plates) at the humidity of W=100% and temperature T=25° C. exceeds 36,000 hours.

According to the first embodiment of the invention, the above technical result is achieved as follows: the protective polymer coating in the thermoelectric module, containing N- and P-type conductivity semiconductor branches connected into an electric circuit through switching buses and a protective polymer coating, is applied onto the entire open surface of the interconnected branches and buses, wherein electrodeposited polymer paint composition modified by fluororubber latex is used as the coating.

The thermoelectric modules may have heat-exchanger plates glued with a thermal conductive adhesive on top of the insulation layer.

According to the second embodiment of the invention, the technical result is achieved as follows: in the thermoelectric module, containing N- and P-type conductivity semiconductor branches connected into an electric circuit through switching buses connected to the respective heat-exchanger plates, and a protective polymer coating, the heat-exchanger plates are made from a non-conductive material, and the protective polymer coating is applied only onto the interconnected branches and buses, wherein electrodeposited polymer paint composition modified by fluororubber latex is used as the coating.

The switching buses' outer sides may be attached to heat-exchanger plates based on the DBC technology (direct bonding of Cu with a heat-exchanger plate made from $Al_2O_3$ by means of a chemical reaction), or glued with a thermal conductive flexible adhesive.

According to the third embodiment of the invention, the technical result is achieved as follows: in the thermoelectric module, containing N- and P-type conductivity semiconductor branches connected into an electric circuit through switching buses, heat-exchanger plates, and a protective polymer coating, one of the heat-exchanger plates is made from a non-conductive material and connected directly to the buses, and the other heat-exchanger plate is connected to the buses through the protective polymer coating covering the buses and the branches, wherein electrodeposited polymer paint composition modified by fluororubber latex is used as the coating.

The switching buses may be connected to one heat-exchanger plate based on the DBC technology or glued with a thermal conductive flexible adhesive.

In all embodiments of the invention the protective polymer coating has a thickness of 5 to 23 micron, fluorine content of 1% to 25% by weight, and is produced by cathodic or anodic electrodeposition from a water-based polymer paint composition with added fluororubber latex and containing a functional monomer with the following composition: up to 70% by weight of fluorine, 1 to 2% by weight of synthanol, 1.5 to 3% by weight of polyethylene glycol.

The essence of the invention is illustrated by the drawings.

Figure 1:
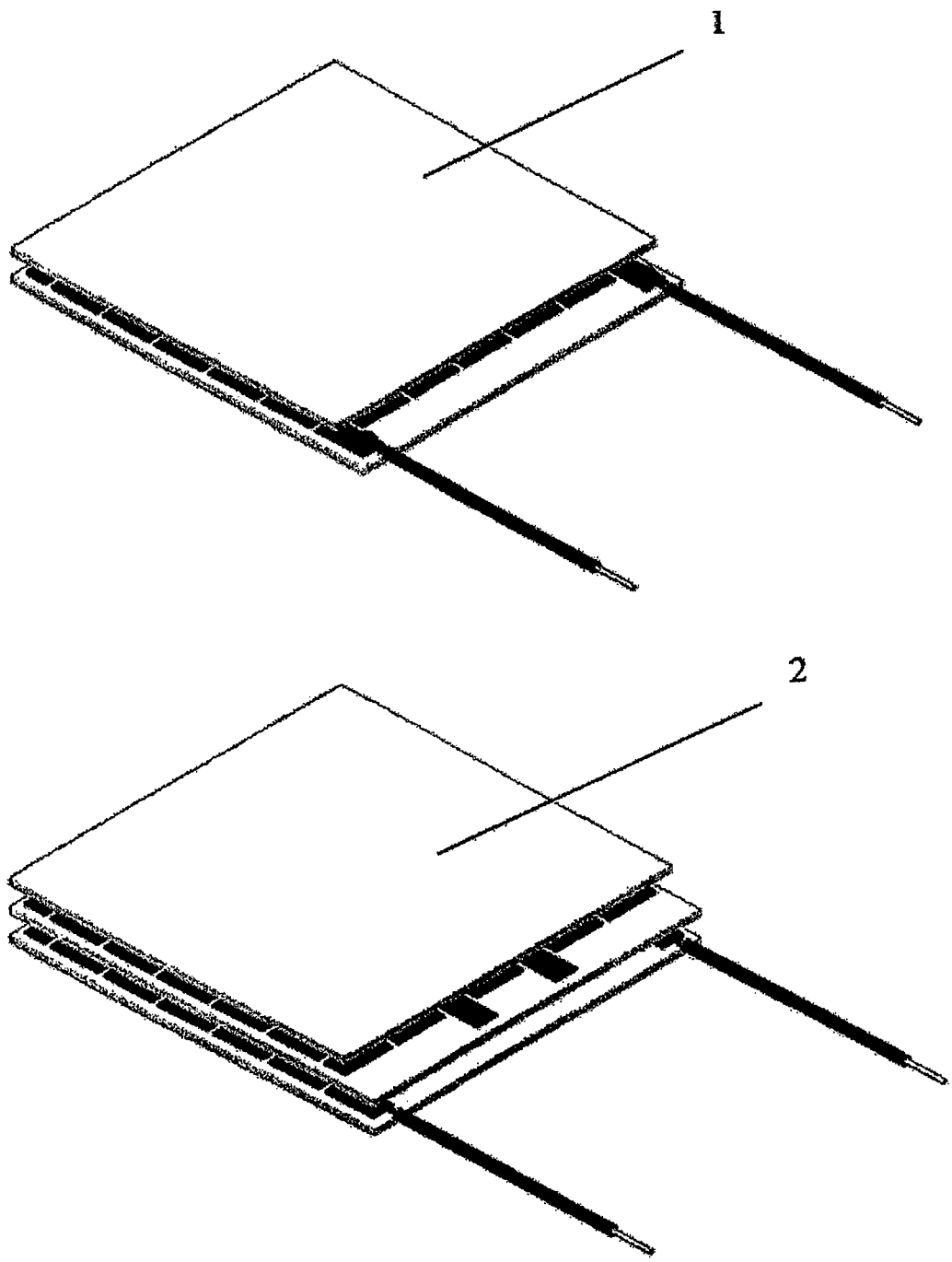
FIG. 1 shows general arrangement of a single-stage and a multi-stage thermoelectric module.
Figure 2:
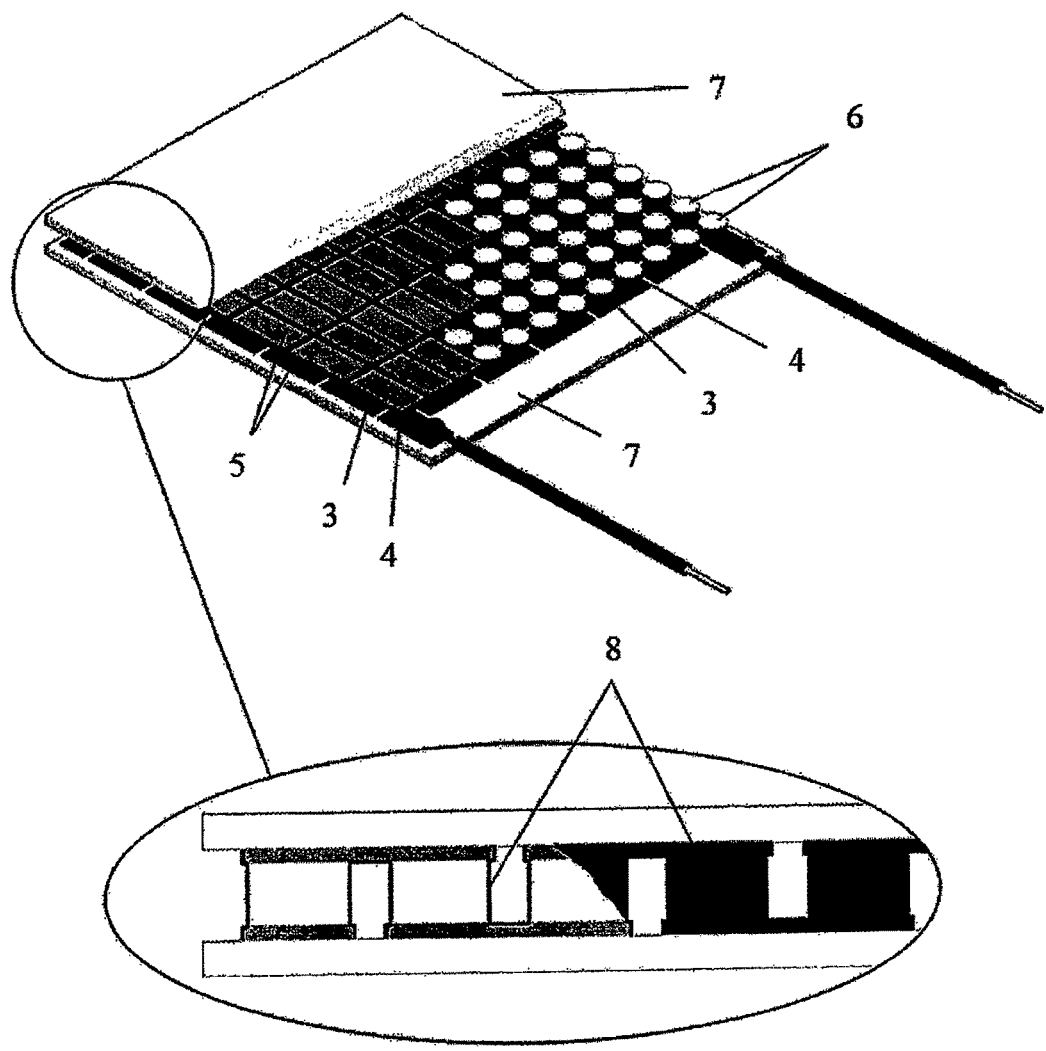
FIG. 2 shows a partial sectional (exploded) view of the thermoelectric module for detailed examination.

A single-stage thermoelectric module 1 or a multi-stage-thermoelectric module 2 (FIG. 1) includes N-type semiconductor branch 3 and P-type semi-conductor branch 4 (FIG. 2) installed in parallel and not touching each other; switching buses 5 connecting the semi-conductor branches 3 and 4 into an electric circuit at the ends 6. All the semi-conductor branches are connected by the switching buses, and the switching buses 5 at their outer sides are attached to heat-exchanger plates 7.

All embodiments of the thermoelectric module are characterized by the utilization of the protective polymer coating 8 which is an electrodeposited polymer paint composition modified by fluororubber latex.

The thermoelectric module according to the first embodiment is characterized by that it may be used without the heat-exchanger plates 7. Where the use of the heat-exchanger plates 7 is required, they are connected with the switching buses 5 through the pre-applied protective polymer coating 8 with the use of a thermal conductive flexible adhesive.

The thermoelectric module according to the second embodiment is characterized by the use of heat-exchanger plates 7 made from a non-conductive material, thus allowing not to apply the protective polymer coating 8 onto the heat-exchanger plates 7 during the coating electrodeposition from the water-based polymer paint composition. Hence, in the second embodiment of the invention the protective polymer coating is applied only onto the interconnected branches and buses of the thermoelectric module.

The thermoelectric module according to the third embodiment is characterized by the use of one (hot) heat-exchanger plate 7 made from a non-conductive material and connected only to the switching buses 5 prior to the application of the protective polymer coating 8 with the use of the DBC process or a thermal conductive flexible adhesive. The other (cold) heat-exchanger plate 7 is connected to the buses 5 through the protective polymer coating covering the buses and the branches, i.e. after the coating electrodeposition.

The coating 8 is applied by the cathodic or anodic electrodeposition method. The P-type conductivity branch materials are solid solutions $(Bi_2Te_3)_X (Sb_2Te_3)_{1-X}$, and $(Bi_2Te_3)_X(Sb_2Te_3)_Y(Sb_2Se_3)_{1-X-Y}$. The N-type conductivity branch materials are solid solutions $(Bi_2Se_3)_X (Bi_2Te_3)_{1-X}$. The semi-conductor branches may be of various cross-sections (round, square, rectangular, etc.) and dimensions. Finished branches 3 and 4 are protected at their ends with anti-diffusion coating made from metal, e.g. Ni, and a coating for brazing in the form of a tin or gold (Au) alloy. The buses 5 are made from copper (Cu) and may have a protective metal, e.g. Ni, coating and a coating for brazing in the form of a tin or gold (Au) alloy. Tin (Sn) based low-melting-point and other solders are used for connecting the branches 3 and 4 with the buses 5. It is proposed to apply protective polymer coating by cathodic or anodic electrodeposition to protect the assembled thermoelectric module against aggressive environmental impacts, high humidity, electrical short circuiting.

To make sure that adhesion of the continuous coating to the thermoelectric module's electrically-conductive parts is strong, a defluxing test of the thermoelectric module has to be carried out with the use of ZESTRON® Flux Test or similar. If the result is satisfactory, the thermoelectric module shall be treated with solvents: isopropyl alcohol at T=45-50° C. t=3 minutes, followed by acetone at T=25° C. t=1 minute, solutions removing oxide films from the branch and copper bus materials and containing organic acids and complexing agents at T=40-45° C. during t=2 to 5 minutes, and washed thoroughly with desalted water in ultrasonic baths 2 times at T=30 to 35° C. during t=1 to 3 minutes. When the thermoelectric module's electrically-conductive surface treatment has been completed, a water-based polymer paint composition with high dispersive capacity shall be applied. The paint composition allows providing uniform in thickness, thin, chemically resistant coatings on complicated shape products. The composition is based on the use of the paint system's components in the required ratios. The composition includes: a binding agent—epoxyamine adduct partially modified by blocked toluene diisocyanate, neutralized by acetic acid in the form of aqueous emulsion with 36 to 38% non-volatile content; pigment paste stabilized by the above adduct (any pigments may be used), with 60 to 64% non-volatile content, and modified with fluororubber latex chemically-resistant additive (copolymers of vinylidene fluoride, hexafluoropropylene, tetrafluoroethylene and a functional monomer with fluorine content of 70% by weight and density of 1.91 kg/cm³), acetic acid and water. Production of coatings on the basis of fluororubber aqueous latex with fluororubber content of at least 60% is an alternative to the solution-based technology (i.e. based on organic solvents that are rather toxic). The polymer water-based paint composition comprises demineralized water, the required quantity of fluororubber latex acidified with acetic acid, film-forming agent emulsion, providing further stabilization of the fluororubber latex particles by the adduct. The pigment paste is added during stirring. To enhance wettability, stabilize the emulsion, to provide dyeing uniformity and protective colloid action, synthanol additives (oxyethylated alcohols being a mixture of polyethylene glycol ethers with various quantities of oxyethyl groups and radical R values) are added to the water-based paint composition. Nonionic surfactants with the general chemical formula $C_nH_{(2n+1)}(C_2H_4O)_m$, where n is the carbon chain length, m is the ethoxylation degree, density 0.95 g/cm³, and polyethylene glycol with an average molecular weight within the range from 1400 to 1600. Working solution is thus obtained with the following properties: solids content 18 to 20%, pH=5.2 to 5.7, electrical conductivity 1400-1800 µS/cm. The coating is applied by the thermoelectric module immersion into an electrodeposition bath equipped with a swinging anode or cathode rod, systems for agitation, ultrasonic degassing and thermostating of the working solution at T=28 to 32° C., an electrodialysis treatment system and a direct current source with U=160-250 V. The thermoelectric module fixed into a holder acts as an anode or a cathode and the plates immersed into the bath specifically for that purpose act as the opposite electrode. The process of coating formation on the thermoelectric module's electrically conductive surface consists in that the water-soluble film-forming resin loses its solubility under the action of electric current and deposits onto the thermoelectric module's electrically conductive surface. Areas of the thermoelectric module's electrically conductive surface located in the maximum current density zone get coated first; then, as the deposited coat's insulating action grows, electric lines of force are re-distributed, and the area of deposition onto the thermoelectric module's electrically conductive surface is moving. As the result, a dense thin electrical insulation coating is formed on the entire surface of the thermoelectric module's electrically conductive part. The electrodeposited coating formation time is 60 to 120 seconds. Upon completion of the paint application, the coating is washed by immersion in a bath with desalted water and thermally hardened in a furnace at 180 to 220° C. during 10 to 30 minutes. Cathodic or anodic electrodeposition provides a coating thickness of 5 to 23 microns.

The thermoelectric module with polymer coating on its electrically conductive parts produced by cathodic or anodic electrodeposition becomes reliably protected against:
 1. Aggressive environmental impacts: corrosion, high humidity.
 2. Electrical short-circuiting.
 3. Branch breakdown due to mechanical or thermal stress.

It has the following advantages over other methods:
 1. Possibility to use in large-scale production.
 2. Adaptability into an automatic process.
 3. Minimum human involvement. (Guaranteed quality of the polymer coating).
 4. Ease of use.
 5. Possibility to further improve sealing. (For specific environments).
 6. Minimum expenditures on consumables. Polymer coating is applied only onto the electrically conductive parts that actually require protection as opposed to the known methods involving excessive use of materials. This is due to the fact that to provide stronger sealing of a thermoelectric module (for specific environments) the ceramic material must be free from polyimide or poly (substituted or unsubstituted) p-xylene, because bonding of materials requires special primers with strong adhesion to both the ceramic material and the sealant (silicone, epoxy, etc.). Polyimide or poly (substituted or unsubstituted) p-xylene cannot have equally strong adhesion to all sealants. In the option with enhanced sealing any additional coat reduces reliability.

The cathodic or anodic electrodeposition method for the thermoelectric module protection is of great importance for producing advanced protective coatings for both conventional and specific applications. It allows improving reliability of the sealing and provides for durable operation of the thermoelectric module.

The invention claimed is:

1. A thermoelectric module, comprising:
semiconductor branches with N- and P-type conductivity, connected into an electrical circuit by switching buses, and a protective polymer coating, wherein the protective polymer coating is produced by a member selected from the group consisting of cathodic electrodeposition or anodic electrodeposition, from a polymer water-based paint composition with added fluororubber latex and containing up to 70% by weight of fluorine, 1 to 2% by weight of a nonionic surfactant, 1.5 to 3% by weight of polyethylene glycol and wherein said protective polymer coating has a thickness of 5 to 23 microns and fluorine content of 1% to 25% by weight.

2. The thermoelectric module according to claim 1, wherein:
the thermoelectric module has heat-exchanger plates glued with a thermal conductive flexible adhesive to the switching buses.

3. The thermoelectric module according to claim 1, wherein: switching buses are connected to heat-exchanger plates made from a non-conductive material, and the protective polymer coating is applied only onto the semiconductor branches and switching buses.

4. The thermoelectric module according to claim 3, wherein: the switching buses have outer sides attached to the heat-exchanger plates based on direct bonding of copper or glued with a thermal conductive flexible adhesive.

5. The thermoelectric module according to claim 1, wherein: switching buses are connected with heat-exchanger plates, wherein one of the heat-exchanger plates is made from a non-conductive material and connected directly to the switching buses, and the other heat-exchanger plate is connected to the switching buses through the protective polymer coating covering the switching buses and the semiconductor branches.

6. The thermoelectric module according to claim 5, wherein: the switching buses have outer sides attached to the heat-exchanger plates based on direct bonding of copper or glued with a thermal conductive flexible adhesive.

7. The thermoelectric module according to claim 1, wherein: the protective polymer coating is applied onto the entire exposed surface of semiconductor branches and switching buses.

8. The thermoelectric module according to claim 7, wherein:
the thermoelectric module has heat-exchanger plates glued with a thermal conductive flexible adhesive through the protective polymer coating to the switching buses.

9. The thermoelectric module according to claim 1, wherein: said nonionic surfactant has a density of 0.95 g/cm$^3$ and a general chemical formula of $C_nH_{(2n+1)}O(C_2H_4O)_m$, where n is the carbon chain length, m is the ethoxylation degree, and wherein said polyethylene glycol has an average molecular weight within the range from 1400 to 1600.

* * * * *